United States Patent
Coglitore et al.

(10) Patent No.: US 7,768,780 B2
(45) Date of Patent: Aug. 3, 2010

(54) FLOW-THROUGH COOLING FOR COMPUTER SYSTEMS

(75) Inventors: Giovanni Coglitore, Saratoga, CA (US); Matthew P. Casebolt, Fremont, CA (US); Robert L. Weisikle, Granite Bay, CA (US)

(73) Assignee: Silicon Graphics International Corp., Fremont, CA (US)

( * ) Notice: Subject to any disclaimer, the term of this patent is extended or adjusted under 35 U.S.C. 154(b) by 383 days.

(21) Appl. No.: 11/764,551

(22) Filed: Jun. 18, 2007

(65) Prior Publication Data

US 2008/0024977 A1 Jan. 31, 2008

Related U.S. Application Data

(60) Provisional application No. 60/815,058, filed on Jun. 19, 2006.

(51) Int. Cl.
H05K 7/20 (2006.01)
(52) U.S. Cl. ............... 361/695; 361/690; 361/694; 165/80.2; 165/122; 174/16.1; 454/184
(58) Field of Classification Search .............. None
See application file for complete search history.

(56) References Cited

U.S. PATENT DOCUMENTS

| | | | |
|---|---|---|---|
| 4,774,631 A | | 9/1988 | Okuyama et al. |
| 5,949,646 A | * | 9/1999 | Lee et al. ............ 361/695 |
| 6,163,454 A | * | 12/2000 | Strickler ............ 361/695 |
| 6,305,180 B1 | | 10/2001 | Miller et al. |
| 6,496,366 B1 | | 12/2002 | Coglitore et al. |
| 6,504,717 B1 | * | 1/2003 | Heard ............ 361/695 |
| 6,574,104 B2 | * | 6/2003 | Patel et al. ............ 361/695 |
| 6,741,467 B2 | | 5/2004 | Coglitore et al. |
| 6,819,563 B1 | * | 11/2004 | Chu et al. ............ 361/696 |
| 6,822,859 B2 | | 11/2004 | Coglitore et al. |
| 6,848,989 B2 | * | 2/2005 | Miyazaki et al. ............ 454/184 |
| 6,850,408 B1 | | 2/2005 | Coglitore et al. |
| 6,867,966 B2 | * | 3/2005 | Smith et al. ............ 361/679.48 |
| 6,878,874 B2 | * | 4/2005 | Osborn et al. ............ 174/50 |
| 7,123,477 B2 | | 10/2006 | Coglitore et al. |
| 7,173,821 B2 | | 2/2007 | Coglitore |
| 7,236,370 B2 | | 6/2007 | Coglitore et al. |
| 7,286,345 B2 | | 10/2007 | Casebolt |
| 7,369,406 B2 | * | 5/2008 | Matsushima et al. ........ 361/695 |

(Continued)

OTHER PUBLICATIONS

International Search Report and Written Opinion for International Application No. PCT/US2007/071561, mailed on Jul. 7, 2008, 8 pages.

*Primary Examiner*—Boris L Chervinsky
(74) *Attorney, Agent, or Firm*—Cooley LLP

(57) ABSTRACT

Systems and method for cooling computer systems are provided. A rack system for housing a plurality of computers is provided, the rack system including: a rack assembly configured to support a first stack of computers and a second stack of computers; and at least one fan assembly configured to create an airflow through the first stack of computers and into the second stack of computers. A method of cooling a plurality of computers in a rack system is provided, including: supporting a first stack of computers and a second stack of computers in a rack assembly; and effectuating an airflow through the first stack of computers and into the second stack of computers.

10 Claims, 3 Drawing Sheets

U.S. PATENT DOCUMENTS 7,436,663 B2 * 10/2008 Matsushima et al. ........ 361/695
7,500,911 B2 * 3/2009 Johnson et al. ............. 454/184

2004/0228087 A1 11/2004 Coglitore

* cited by examiner

FLOW-THROUGH COOLING FOR COMPUTER SYSTEMS

CROSS-REFERENCE TO RELATED APPLICATIONS

This application claims the benefit of provisional patent application No. 60/815,058, filed Jun. 19, 2006, by the present inventors, the disclosure of which is incorporated by reference in its entirety.

BACKGROUND

As information technology has rapidly progressed, computer network centers such as server farms and server clusters have become increasingly important to our society. The server farms provide efficient data processing, storage, and distribution capability that supports a worldwide information infrastructure, which has come to dominate how we live and how we conduct our day to day business. A server farm is a group or cluster of computers acting as servers and housed together in a single location.

Typically, at a site where numerous computers are connected to a network, the computers are stacked in racks and arranged in repeating rows or cells. Access to the computers may be needed for servicing, upgrading hardware, loading software, attaching cables, switching power on and off, and so forth. The elimination of as much access space as is feasible can increase the density of computer systems that may be provided for a given square footage of area at a site.

A standard rack that is widely used measures roughly 19 inches wide, 30 inches deep and 74 inches high. These racks may be arranged in rows of, for example, roughly 10-30 units, with access doors on each side of the racks. Access aisles are provided on both sides of the rows so that an operator may approach the access doors on each side. Many of the racks are filled with cumbersome computers mounted on sliders which are attached through mounting holes provided in the front and back of the rack.

In conventional rack-based computer systems, a plurality of computers are supported in a single stack in a rack. The rack may include a rack assembly having a front door and a back door. Each of the computers typically includes a computer chassis having a main board and other components, such as one or more power supplies, hard drives, processors, expansion cards, contained within the chassis. The front door of the rack assembly provides access to the front sides of the computers and the back door provides access to the back sides, where the I/O ports for the computers are typically provided. Each computer may also include one or more fans that draw ambient air into vents provided on one side of the computer, through the computer chassis, and out of vents provided on the opposite side of the computer. The ambient air passing through the computers is used to cool the various components contained within the computer chassis.

In order to optimize the cooling of the rack-mounted computer systems, many data centers utilize a hot aisle/cold aisle layout in which the computers in adjacent rows alternate directions. Thus, the front sides of the computers in a first row face the front sides of the computers in an adjacent row, and the back sides of the computers in the first row face the back sides of the computers in an adjacent row. As a result, cold air is segregated in front of equipment cabinets and hot exhaust air is expelled behind equipment cabinets. The HVAC (heating, ventilation and air-conditioning) system is configured to deliver cold air to the cold aisles (typically through perforated floor tiles) and to vent heated air from the hot aisles (typically through vents in the ceiling). This layout avoids the direct transfer of hot exhaust air from one system into the intake air of another system.

As the number of computers in a server farm is increased, two competing factors come into play: consumption of floor space and heat management. As one increases the density of computers, problems associated with heat dissipation rise dramatically. One of the major causes of electronic component failure is overheating. High performance electronics such as CPUs generate substantial amounts of heat. Hard drives and power supplies generate substantial amounts of heat as well, thereby placing further demands on effective heat dissipation. In order for computers to continue to operate properly, appropriate heat dissipation pathways should be provided. Because each computer contains thousands of heat producing electronic parts, as the density of the computers is increased, one must also address the difficult issues of providing proper cooling mechanisms to remove heat from the individual computer nodes and the clusters as a whole. Therefore, it is desirable to provide an improved cooling system for rack-based computer systems.

SUMMARY

In accordance with the present invention, a rack system for housing a plurality of computers is provided, comprising: a rack assembly configured to support a first stack of computers and a second stack of computers; and at least one fan assembly configured to create an airflow through the first stack of computers and into the second stack of computers.

In accordance with other embodiments of the present invention, a method of cooling a plurality of computers in a rack system is provided, comprising: supporting a first stack of computers and a second stack of computers in a rack assembly; and effectuating an airflow through the first stack of computers and into the second stack of computers.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Some portions of the detailed description which follows are presented in terms of procedures, steps, logic blocks, processing, and other symbolic representations of operations on data bits that can be performed on computer memory. Each step may be performed by hardware, software, firmware, or combinations thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1:
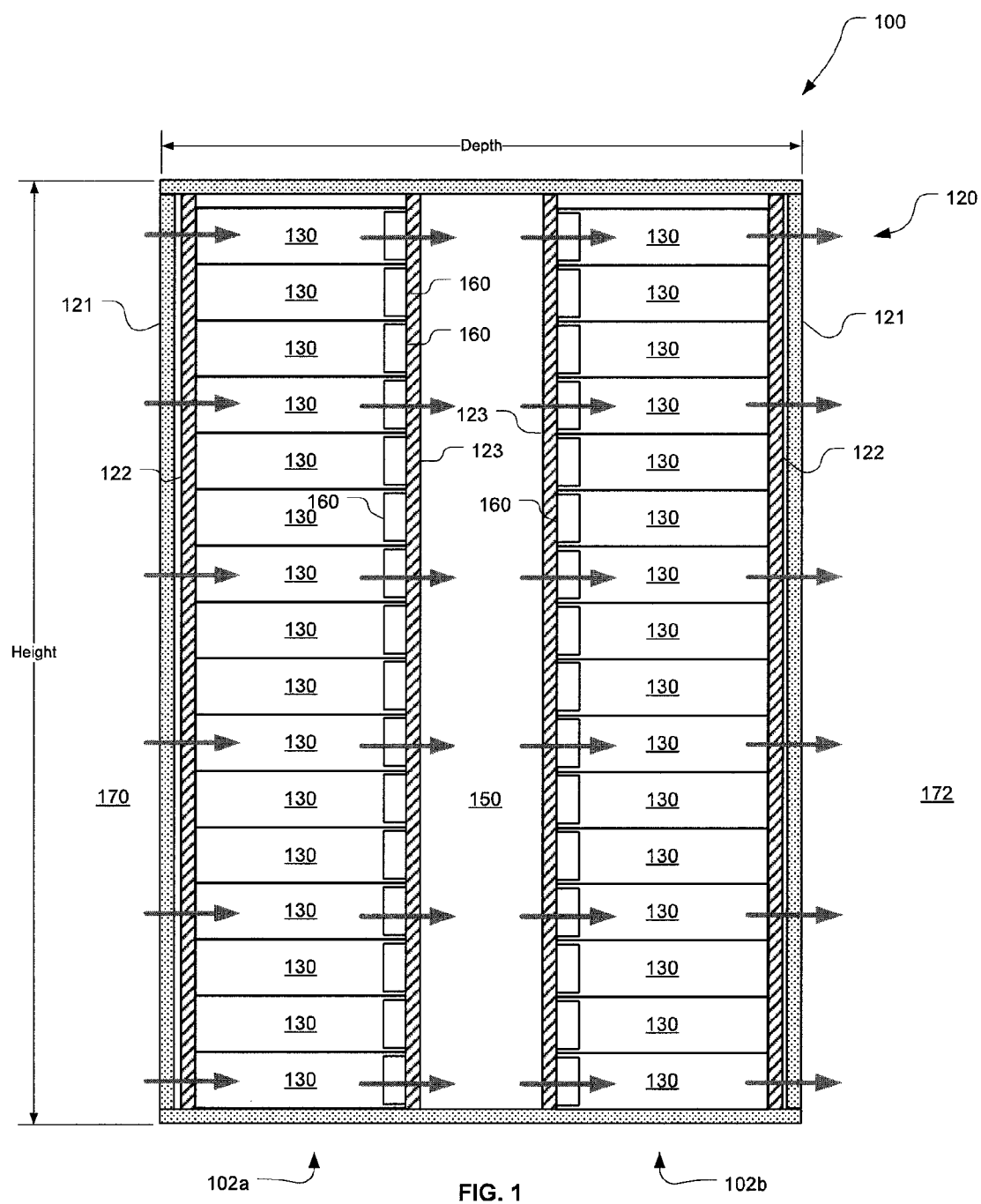
FIG. 1 shows a simplified cross-sectional side view of a rack-based system having a plurality of computers supported therein, in accordance with embodiments of the present invention.

FIG. 1 shows a simplified cross-sectional side view of a rack-based computer system (or rack system) 100 having a plurality of computers 130 supported therein. The computer system 100 has dimensions of approximately 84"H×40"D×26"W and includes a rack assembly 120 containing mounting arrangements for removably supporting a plurality of computer chassis in a stacked manner. The rack assembly 120 comprises a frame 121 and a plurality of vertical support members 122-123. Each of the computers 130 are attached to and supported by the vertical supports 122-123 using thumbscrews or pins or the like. The rack assembly 120 also typically includes a plurality of side panels and doors (not shown) which are mounted to the frame 121 to provide a more complete enclosure for the computers 130. In some embodiments, rails may be provided for supporting the computers 130 in the rack assembly 120. In other embodiments, the rails may be omitted.

The computer 130 is a general purpose computer system designed to perform computations and/or data processing, and typically includes a central processing unit (CPU) and memory. The CPU and memory may be provided on a printed circuit board (PCB) main board. The PCB main board may be mounted onto a chassis structure, such as, for example, a sheet of metal or a supporting frame. Multiple computer components, such as, e.g., hard drives, power supplies, processors, memory modules, cables, etc., may be mounted on or coupled to the main board of the computer or chassis structure. Some computers 130 include a generally rectangular housing having vents provided on two or more sides, which allow cooling air to be passed through the housing to cool the various components contained inside the housing. Fan assemblies may be included for moving the air through the computers. The housing may also include flanges or other mechanical structures which facilitate the mounting of the computer 130 in a rack assembly 120. Alternatively, the computer 130 may comprise a printed circuit board (PCB) having exposed components without an enclosure.

In some embodiments, the computers 130 in the rack assembly 120 comprise server-class computers. A server is a computer on a network that may, among other tasks, manage network resources. The server may be dedicated to a particular purpose and may store data and/or perform various functions for that purpose. In some embodiments, storage arrays may also be mounted in the rack assembly 120.

Each of the computers 130 may have a front side and an opposing back side, a top and an opposing bottom, and two opposing lateral sides. The front side of the computer 130 is the side which faces the user when the computer 130 is mounted in the rack assembly 120. As can be seen in FIG. 1, the computers 130 are supported in two stacks 102a, 102b in a back-to-back arrangement such that the back sides of the computers 130 face inward to form a central plenum 150. This arrangement can allow a user to access the front sides of the computers 130 in both stacks 102a-102b without removing the computers 130 from the rack assembly 120.

Figure 3:
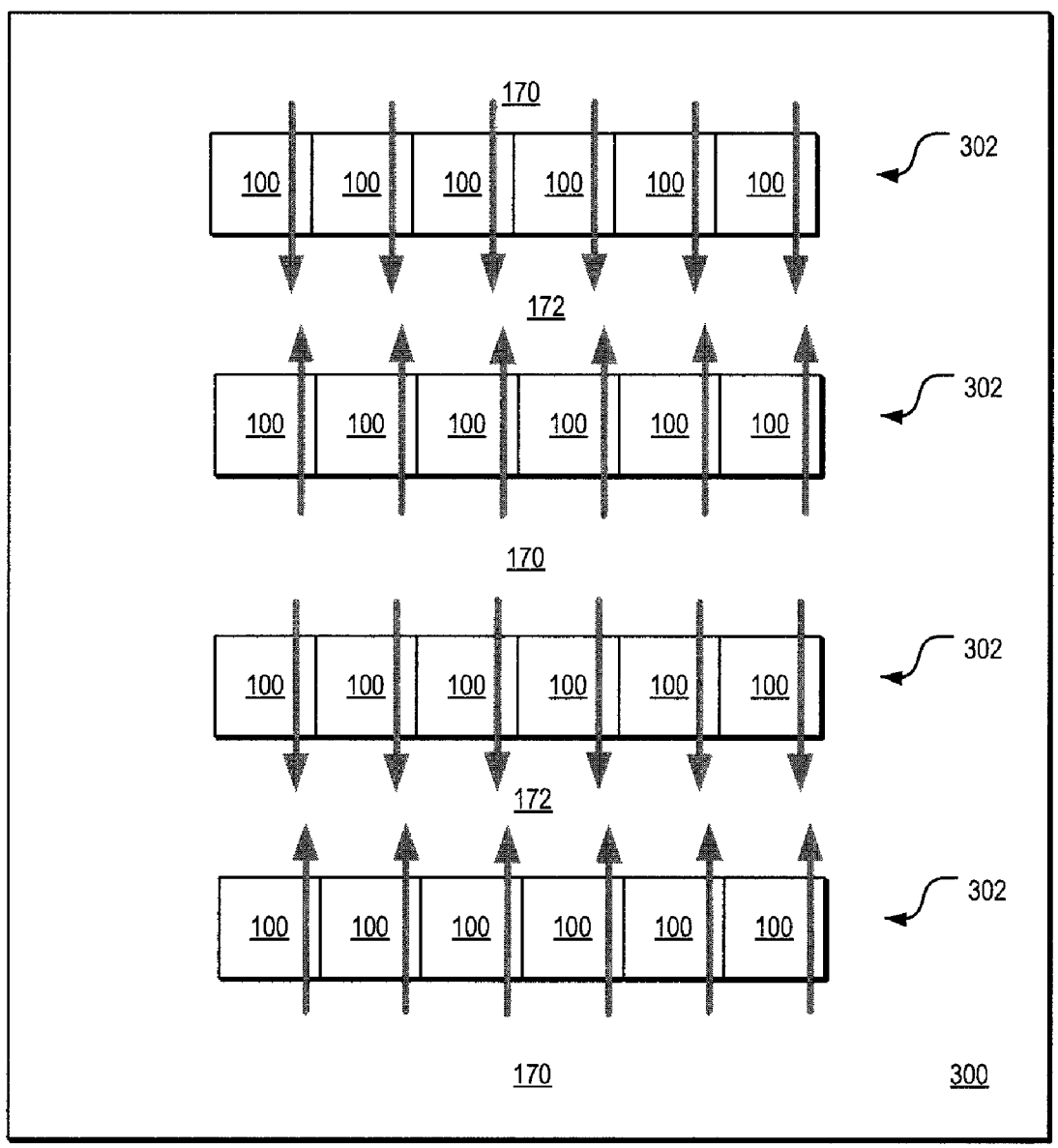
FIG. 3 is a simplified plan view of a data center in which a plurality of computer systems are installed in a series of parallel rows separated by hot and cold aisles.

FIG. 3 is a simplified plan view of a data center 300 in which a plurality of computer systems 100 are installed in a series of parallel rows 302 separated by hot aisles 172 and cold aisles 170.

As described above, the two stacks 102a-102b of computers 130 and the rack assembly 120 cooperate to form the central plenum 150. The rack assembly 120 may comprise, for example, a standard-sized rack, or may have different dimensions. In one embodiment, the rack assembly 120 measures approximately 84"H×40"D×24"W. In another embodiment, the rack assembly 120 measures approximately 74"H×40"D×24"W. A similar arrangement of computers 130 is described in U.S. Pat. No. 6,496,366, to Coglitore et al., filed on Jan. 7, 2000, incorporated by reference herein in its entirety.

In the systems described in U.S. Pat. No. 6,496,366, the cooling air flows into the front sides of both stacks of computers and is exhausted into the central plenum. The heated air is then exhausted upwards and/or downwards out of the plenum. Alternatively, the airflow may be reversed such that cool air is drawn into the central plenum and exhausted out through the front sides of both stacks of computers. In contrast, in the system 100 shown in FIG. 1, cooling air flows from a cold aisle 170 into the front sides of the computers 130 in the first stack 102a, as shown by the arrows in FIG. 1. This cooling air is used to cool the components contained in the computers 130 and is exhausted out of the back sides of the computers 130 in the first stack 102a and into the central plenum 150.

The air from the central plenum 150 then flows into the back sides of the computers 130 in the second stack 102b in order to cool the components in the second stack 102b. This air is then exhausted out of the front sides of the computers 130 in the second stack 102b and into the hot aisle 172. In some embodiments, cool air may be drawn into the plenum from sources other than the first stack 102a of computers 130, such as, e.g., through airflow openings at the top and/or bottom of the plenum 150. In other embodiments, no airflow openings are provided at the top and bottom of the plenum. Thus, substantially all of the air used to cool the second stack 102b has first passed through the first stack 102a of computers 130. In addition, the air pressure within the plenum 150 may be greater than the air pressure outside of the rack assembly 120, thereby substantially preventing air from entering the plenum 150 from outside the rack assembly 120 through small crevices or openings in the rack assembly 120.

The flow of air through the computers 130 in the stacks 102a-102b may be effectuated in a variety of ways. In the illustrated embodiment, a fan assembly 160 is provided inside the chassis of each computer 130 adjacent openings on the back sides of the computers 130. Each fan assembly 160 may comprise one or more air movers (e.g., fans) for forcing the movement of air through the computers 130. The fan assemblies 160 in the first stack 102a are configured so as to draw air from the interior of the computers 130 in the first stack 102*a* and to exhaust the air into the central plenum 150. The fan assemblies 160 in the second stack 102*b* are configured so as to draw air from the central plenum 150 and to exhaust the air into the interior of the computers 130 in the second stack 102*b*. The positive pressure created by the fan assemblies 160 within the computers 130 causes the air to be expelled from the front sides of the computers 130 in the second stack 102*b*.

In other embodiments, the flow of air through the computers 130 may be effectuated in other ways. For example, the fan assemblies need not be located adjacent the back sides of the computers, and could be provided elsewhere within the computer chassis (e.g., adjacent the front sides of the computers) or external to the computer chassis (e.g., adjacent the front and/or back sides of the computers).

Figure 2:
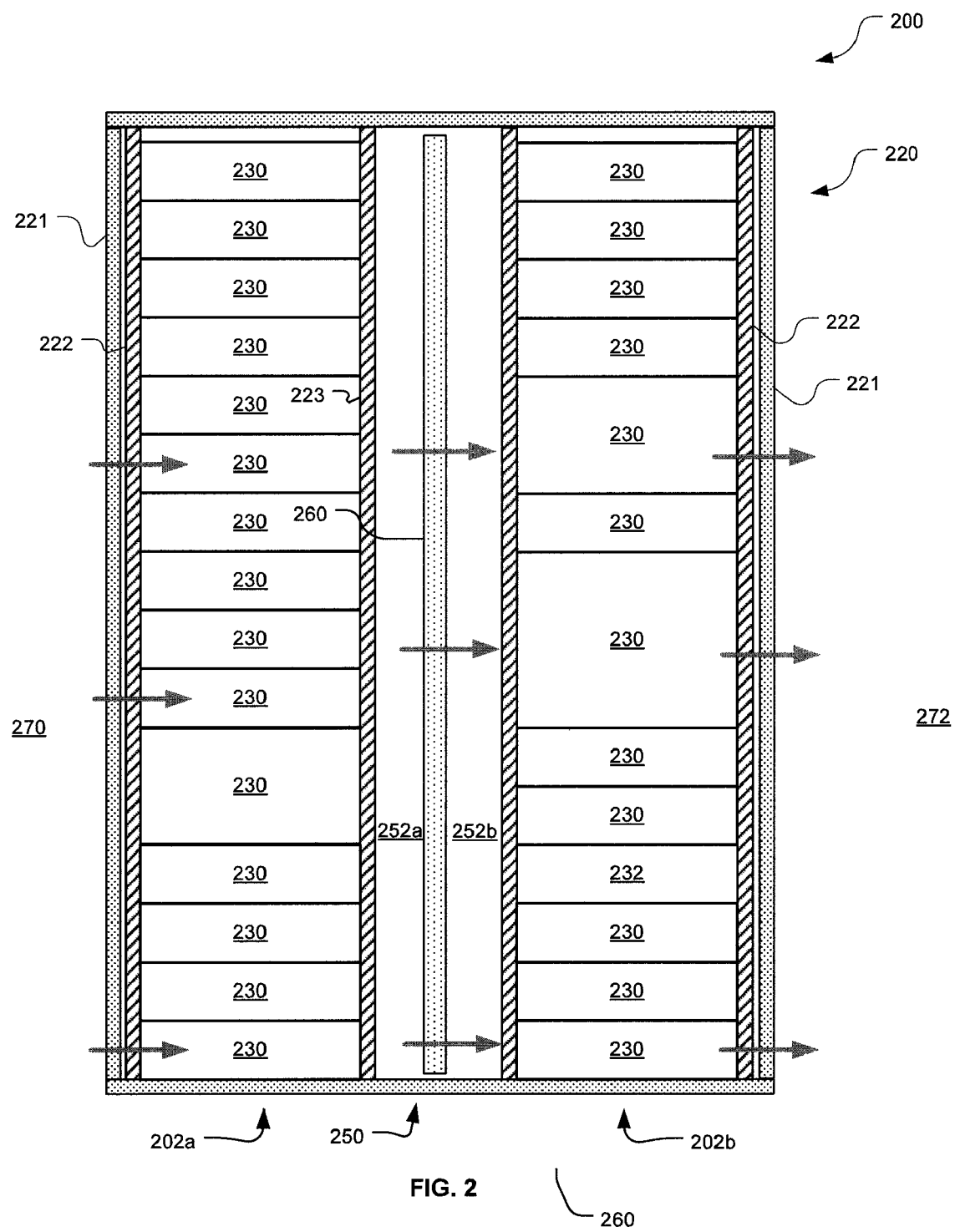
FIG. 2 shows a simplified cross-sectional side view of a rack-based system having a plurality of computers supported therein, in accordance with other embodiments of the present invention.

FIG. 2 is a simplified block diagram of a system 200, in accordance with another embodiment of the present invention. The system 200 includes a rack assembly 220 which is configured to support two stacks 202*a*-202*b*. In one embodiment, each stack 202*a*-202*b* supports components having a total height of 44 rack units (i.e., approximately 77 inches of vertical clearance). In this embodiment, a central fan assembly 260 is provided inside the central plenum 250. The central fan assembly 260 may comprise a frame having a plurality of fans provided thereon. The fan assembly 260 divides the central plenum 250 into two sections 252*a*-252*b*.

In operation, the fans in the fan assembly 260 are configured to move air from one section to the other. In the illustrated embodiment, the fan assembly 260 draws air from the first section 252*a* and blows the air into the second section 252*b*. This creates a negative pressure in the first section 252*a*, which draws air from the interior of the computers 230 in the first stack 202*a* into the first section 252*a*, which, in turn, draws cooling air from the cold aisle 270 into the computers 230 in the first stack 202*a*. In addition, the fan assembly 260 produces a positive pressure in the second section 252*b*, which forces air into the back sides of the computers 230 in the second stack 202*b* and out of the front sides into the hot aisle 272.

In some embodiments, when the central fan assembly 260 is used, fewer fans may used within each computer 230 or the fans may be eliminated altogether from the computers 230, thereby decreasing the cost of each computer 230. In addition, because the diameter of the fan blades is not limited by the height of the computer chassis, a fewer number of larger, more energy-efficient fans may be used to move the air through the system 100.

Another potential advantage that may be achieved by embodiments of the present invention is that more effective cooling may be achieved by increasing the distance between the fans and the components being cooled. With axial-flow fans, which are commonly used for cooling computer components, a plurality of blades are mounted onto a rotating hub. The rotation of the blades about the axis of the fan causes the air to flow along the axis of the fan. The flow of air emitted by the fan has a profile that changes according to distance from the fan blades and radial distance from the hub. Because the air is moved by the blades and not the hub, the region immediately adjacent to the blades experiences a high level of airflow and the region immediately adjacent to the hub along the axis of the fan generally experiences very little airflow and is sometimes referred to as a "dead zone." With increasing distance from the fan, the air flow along axis of the fan increases and the profile of the airflow becomes more uniform.

If the fan is provided within the computer chassis, there may be components requiring cooling that are located in or near the dead zone immediately adjacent to the fan hub. These components may experience less airflow, thereby decreasing the effectiveness of the cooling. In contrast, if the fan is provided some distance away from the computer chassis, as shown in FIG. 2, the dead zone is located further from the components requiring cooling. Thus, a more uniform and effective cooling airflow may be provided.

In some embodiments, including some of the back-to-back systems described above, the computers mounted in the rack assemblies may have various features provided on the front sides of the computers 130 so as to effectuate easy access to those features by a technician without having to remove the computers 130 from the rack assembly 120. The features provided on the front sides of the computers 130 may include, for example, one or more I/O ports or removable components, such as removable power supplies or removable storage devices, which may be removed from the computers 130 without opening up the computer chassis. For instance, in some embodiments, substantially all or all I/O ports and other interfaces that are accessed while the computer is in operation can be provided on the front sides of the computers. Thus, the back-to-back arrangement of computers does not impair the operator's access to necessary components. In this case, the back sides of the computers are rarely or never accessed.

While the invention has been described in terms of particular embodiments and illustrative figures, those of ordinary skill in the art will recognize that the invention is not limited to the embodiments or figures described. For example, the size, configuration, and orientation of computers may vary. In some embodiments, the computers are oriented in the rack assembly such that the main boards in the computers are approximately parallel to the floor of the data center. In other embodiments, the computers may be oriented differently. For example, the computers may be positioned so that the main boards are perpendicular to the floor.

Many of the embodiments described above refer to the computer systems being utilized as part of a server farm. In other embodiments, the rack assemblies may include other types of systems, such as, for example, storage arrays. The multiple computers in a single stack may be identical or may be different. In some embodiments, the computers in a stack may have different form factors (e.g., some computers have a 1U profile, while others have a 2U or 3U profile) and may be configured to perform different tasks (e.g., one or more computers may be configured as central controllers, while other equipment in the stack may be configured as storage arrays).

In addition, while some of the embodiments described above refer to computer racks fully or partially populated with computers, it is to be understood that in other embodiments, various types of equipment may be mounted in one or more of the available shelf locations in the rack assembly. For example, one or more of the locations may be consumed by dedicated power supplies, routers, switches, keyboards, or other electronic components. These components may or may not be configured to utilize a flow of cooling air during operation.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A rack system for housing a plurality of computers, comprising:
   a rack assembly configured to support a first stack of computers and a second stack of computers, each computer in the first stack of computers and in the second stack of computers having a front side and a back side opposite the front side, with the back side of each of the first stack of computers facing the back side of each of the second stack of computers; and
   a plurality of fan assemblies configured to create an airflow through the first stack of computers and into the second stack of computers, wherein the plurality of fan assemblies comprises:
      a first fan assembly in each computer in the first stack of computers, the first fan assembly configured to create an airflow entering the front side and exiting the back side of each computer in the first stack of computers; and
      a second fan assembly in each computer in the second stack of computers, the second fan assembly configured to create an airflow entering the back side and exiting the front side of each computer in the second stack of computers.

2. The rack system of claim 1, wherein:
   the first stack of computers and the second stack of computers define a central plenum therebetween.

3. The rack system of claim 1, wherein:
   the plurality of computers comprises a plurality of servers.

4. The rack system of claim 1, wherein:
   the rack assembly measures less than approximately 100" by approximately 52" by approximately 38".

5. A rack system, comprising:
   a rack assembly configured to support a first computer and a second computer adjacent to the first computer in a back-to-back configuration, each of the first computer and the second computer having a front side and a back side opposite the front side with the back side of the first computer facing the back side of the second computer; and
   at least one fan assembly configured to create an airflow entering the front side and exiting the back side of the first computer, then entering the back side and exiting the front side of the second computer;
   wherein the first computer and the second computer define a central plenum therebetween; and
   the at least one fan assembly is provided in the central plenum.

6. The rack system of claim 5, wherein:
   the first and second computers comprise servers.

7. The rack system of claim 5, wherein:
   the rack assembly measures less than approximately 100" by approximately 52" by approximately 38".

8. A method of cooling a plurality of computers in a rack system, comprising:
   supporting a first stack of computers and a second stack of computers in a rack assembly, each computer in the first stack of computers and in the second stack of computers having a front side and a back side opposite the front side, with the back side of each of the first stack of computers facing the back side of each of the second stack of computers; and
   effectuating an airflow through the first stack of computers and into the second stack of computers, said effectuating the airflow comprising:
      operating a first fan assembly in each computer in the first stack of computers to create an airflow entering the front side and exiting the back side of each computer in the first stack of computers; and
      operating a second fan assembly in each computer in the second stack of computers to create an airflow entering the back side and exiting the front side of each computer in the second stack of computers.

9. The method of claim 8, wherein:
   the plurality of computers comprises a plurality of servers.

10. The method of claim 8, wherein: the rack assembly measures less than approximately 100" by approximately 52" by approximately 38".

* * * * *